United States Patent
Amer

(10) Patent No.: US 7,623,585 B2
(45) Date of Patent: Nov. 24, 2009

(54) SYSTEMS AND MODULES FOR USE WITH TRELLIS-BASED DECODING

(76) Inventor: Maher Amer, 391 Beatrice Road, Nepean, Ontario (CA) K2J 4Y7

( * ) Notice: Subject to any disclaimer, the term of this patent is extended or adjusted under 35 U.S.C. 154(b) by 459 days.

(21) Appl. No.: 10/377,859

(22) Filed: Feb. 28, 2003

(65) Prior Publication Data

US 2004/0181745 A1 Sep. 16, 2004

(51) Int. Cl.
H04L 27/28 (2006.01)
(52) U.S. Cl. .................. 375/262; 375/265; 375/341; 704/242; 714/795
(58) Field of Classification Search .................. 375/365, 375/341, 260, 264, 262, 265, 362, 641; 704/242; 714/794–796, 791, 786
See application file for complete search history.

(56) References Cited

U.S. PATENT DOCUMENTS

| | | | | |
|---|---|---|---|---|
| 4,606,027 A * | 8/1986 | Otani | ............... | 714/795 |
| 4,614,933 A * | 9/1986 | Yamashita et al. | ............... | 341/51 |
| 5,150,369 A * | 9/1992 | Costa et al. | ............... | 714/796 |
| 5,329,537 A | 7/1994 | Alard et al. | ............... | 371/43 |
| 5,418,795 A * | 5/1995 | Itakura et al. | ............... | 714/746 |
| 5,448,583 A * | 9/1995 | Miyamoto et al. | ............... | 714/795 |
| 5,596,604 A | 1/1997 | Cioffi et al. | | |
| 5,787,127 A * | 7/1998 | Ono et al. | ............... | 375/341 |
| 5,802,115 A | 9/1998 | Meyer | ............... | 375/341 |
| 5,907,586 A * | 5/1999 | Katsuragawa et al. | ............... | 375/341 |
| 6,189,126 B1 * | 2/2001 | Ulmer et al. | ............... | 714/795 |
| 6,301,314 B1 * | 10/2001 | Murayama | ............... | 375/341 |
| 6,317,472 B1 * | 11/2001 | Choi et al. | ............... | 375/341 |
| 6,868,521 B2 | 3/2005 | Cohen | | |
| 7,143,335 B2 * | 11/2006 | Choi | ............... | 714/795 |

2002/0031195 A1 3/2002 Honary

FOREIGN PATENT DOCUMENTS

EP 0543554 A1 5/1993

(Continued)

OTHER PUBLICATIONS

He et. al., "An area efficient analog VLSI architecture for state-parallel Viterbi Decoding", IEEE 1999.*

(Continued)

*Primary Examiner*—Mohammad H Ghayour
*Assistant Examiner*—Sophia Vlahos
(74) *Attorney, Agent, or Firm*—Stolowitz Ford Cowger LLP

(57) ABSTRACT

Systems and modules for use in trellis-based decoding of convolutionally encoded sets of data bits. A first calculation module receives an encoded set of data bits and calculates a signal distance or a measure of the differences between the encoded set and each one of a group of predetermined states. The first calculation module consists of multiple parallel calculation submodules with each submodule being tasked to perform an XOR operation between the encoded set and one of the predetermined states. Multiple parallel second calculation modules each receiving the output of the first calculation module, calculate cumulative signal distances using the output of the first calculation module. Each second calculation module outputs its lowest valued cumulative signal distance and this may be used as input to a memory system for storing a database used in further decoding of the encoded data.

7 Claims, 3 Drawing Sheets

FOREIGN PATENT DOCUMENTS

| EP | 0553050 A1 | 7/1993 |
| EP | 0762659 A2 | 3/1997 |
| EP | 0762659 A3 | 3/1997 |
| WO | WO02/21699 A2 | 3/2002 |
| WO | WO02/21699 A3 | 3/2002 |

OTHER PUBLICATIONS

Black et. al., "A 140Mb/s, 32-State, Radix-4 Viterbi decoder" IEEE 1992.*

Black et al. "A 140-Mb/s, 32-State, Radix-4 Viterbi Decoder". IEEE, Dec. 1992.*

PCT Communication Relating to the Results of the Partial International Search for Application No. PCT/CA2004/000282.

E. Paaske et al., *An area-efficient path memory structure for VLSI implementation of high speed Viterbi decoders*, 8220 Integration, The VLSI Journal, Nov. 1991, No. 1, pp. 79-91, Amsterdam, NL.

G. Fettweis et al., *Feedforward Architectures for Parallel Viterbi Decoding*, Journal of VLSI Signal Processing, 3, pp. 105-119 (1991).

Proakis, John G., Chapter 8—Block and Convolutional Channel Codes, Digital Communications, Third Edition, pp. 483-500, McGraw-Hill, Inc.

United States Patent and Trademark Office; U.S. Appl. No. 11/668,998, filed Jan. 30, 2007; File History.

United States Patent and Trademark Office; U.S. Appl. No. 10/377,860, filed Feb. 28, 2003; File History.

International Bureau of WIPO; PCT/CA2004/000282 filed Feb. 26, 2004; International Preliminary Report on Patentability; Sep. 2, 2005.

* cited by examiner

SYSTEMS AND MODULES FOR USE WITH TRELLIS-BASED DECODING

FIELD OF THE INVENTION

The present invention relates to decoding systems used for wireless communications and, more specifically, is particularly applicable but not limited to systems and modules which may be used in decoding systems using a trellis-based decoding method.

BACKGROUND OF THE INVENTION

The communications revolution of the 1990's has led to an explosion of growth in the wireless communications field. Wireless telephones, personal communications services (PCS) handsets, and wireless computer networks are just a few of the products of this revolution. As larger and larger amounts of voice and data communication content are being transmitted by wireless links, there is a greater need for higher transmission rates. Unfortunately, such higher transmission rates are generally constrained by the speed at which data can be encoded and/or decoded both prior to and after transmission via a wireless link.

Different methods for encoding and decoding are currently available. One type of decoding method for decoding convolutionally encoded data that has gained general acceptance is trellis-based decoding, the most well known of which is the Viterbi algorithm. In trellis-based decoding, and in the Viterbi algorithm in particular, multiple encoded sets of binary data are serially processed. However, such processing requires that multiple calculations be made for each encoded set of data. Also, for each set of calculations done, multiple other calculations need to be performed to obtain the metrics or measurements that are to be used in determining the original unencoded bit sequence.

Essentially, calculations have to be made to determine how different each encoded set is from a predetermined group of states or sets of data bits. Then, based on the results of these determinations, the previous or originating state from which each state resulted has to be found. The previous states for each state are then used to trace back the original unencoded set of bits.

These calculations have previously been done serially and, even though high clock speeds have been applied, the throughput of the system has been lacklustre. Also, such high clock speeds are disadvantageous for low power systems.

Based on the above, there is therefore a need for systems or devices which will allow for faster throughput in the calculations involved in trellis-based decoding. Such solutions should also be usable with memory subsystems optimized for trellis-based decoding and should allow for high throughput even at lower clock speeds.

SUMMARY OF THE INVENTION

The present invention provides systems and modules for use in trellis-based decoding of convolutionally encoded sets of data bits. A first calculation module receives an encoded set of data bits and calculates a signal distance or a measure of the differences between the encoded set and each one of a group of predetermined branch values, each branch value being represented by a sequence of data bits. The first calculation module consists of multiple parallel calculation submodules with each submodule being tasked to perform a metric calculation between the encoded set and one of the predetermined states. Multiple parallel second calculation modules, each one receiving the output of the first calculation module, calculates cumulative signal distances. Each second calculation module has multiple parallel addition submodules with each addition submodule receiving a specific cumulative signal distance and one of the signal distances calculated by the first calculation module. Each second calculation module also includes a decision module which selects the lowest valued cumulative signal distance from the output of the addition submodules. Each second calculation module outputs the state which produced the lowest valued cumulative signal distance and this may be used as input to a memory system for storing a database used in further decoding of the encoded data.

In a first aspect, the present invention provides a system for decoding an encoded set of data bits, the system comprising:
  a first calculation module for calculating a signal distance between said encoded set and each one of a predetermined set of branch values, each one of said predetermined set of branch values comprising a predetermined sequence of data bits; and
  a plurality of second calculation modules in parallel for calculating a cumulative signal distance for each one of a predetermined set of predecessor states using an output of said first calculation module, each one of said second calculation modules being associated with a specific one of said predetermined set of predecessor states, said encoded set having more than 2 bits.

In a second aspect, the present invention provides a calculation module for use in trellis-based decoding of an encoded set of data bits, the module comprising a plurality of calculation submodules, each of said plurality of calculation submodules comprising:
  metric means for determining differences between said encoded set of data bits and one of a predetermined set of branch values, each of said predetermined set of branch values comprising a predetermined sequence of data bits; and
  count means for determining a number of bit differences between said encoded set and said one a predetermined set of branch values using an output of said metric means.

In a third aspect, the present invention provides a calculation module for use in trellis-based decoding of an encoded set of data bits, the module comprising:
  a plurality of addition submodules operating in parallel, each addition submodule comprising an addition circuit receiving a preselected signal distance in binary format and a preselected cumulative signal distance in binary format, said addition circuit adding said preselected signal distance and said preselected cumulative signal distance to output a number in binary format; and
  a decision submodule receiving outputs of said plurality of addition submodules, said decision submodule determining which one of said outputs conforms to a predetermined criterion.

BRIEF DESCRIPTION OF THE DRAWINGS

A better understanding of the invention will be obtained by considering the detailed description below, with reference to the following drawings in which.

DETAILED DESCRIPTION

Trellis-based decoding uses multiple similar calculations for each step or state in the trellis, multiple states forming every transition in a trellis diagram. Each of the multiple states is derived from a finite number of states in the sequence as determined by a state diagram. Each transition is calculated whenever a new set of encoded bits arrive and, for every one of the states, multiple similar calculations are performed.

The idea behind such trellis based decoding is that each encoded set resulted from a small number of possible unencoded sets of bits. Using a state diagram which details the possible transformations that an unencoded set may undergo and knowing beforehand the possible end states for each transformation, the transformations can be mapped for the encoded set. Since the possible states are finite in number, the encoded set is compared to each possible input sequence (branch values) which, if input, would have resulted in the current state and a metric or measurement of how different the encoded set is from each branch value is generated.

Once the metrics between the encoded set and each of the branch values are calculated, these can then be used to determine a cumulative metric for each of the paths that each branch value may have resulted from. In essence, trellis-based decoding receives a set of encoded bits at each transition and, for each transition, multiple possible states exist. Each of these possible states would have resulted from a branch value and, depending on how different an incoming data set is from the possible branch values, a different metric is calculated. These metrics are then used to find, for each of the possible paths, a total or cumulative metric. Then, based on these cumulative metrics for each of the paths, a "winning" path is chosen. Since each one of these preceding states will, at the next transition, lead to at least one preceding state in the next transition, by mapping the states in every transition and tracing the route or path back from a final state, the original unencoded bits can be found. The present invention allows for the quick and simple generation of the metrics required for each transition and for the calculations required to determine which is the state in the sequence for a given path.

Figure 1:
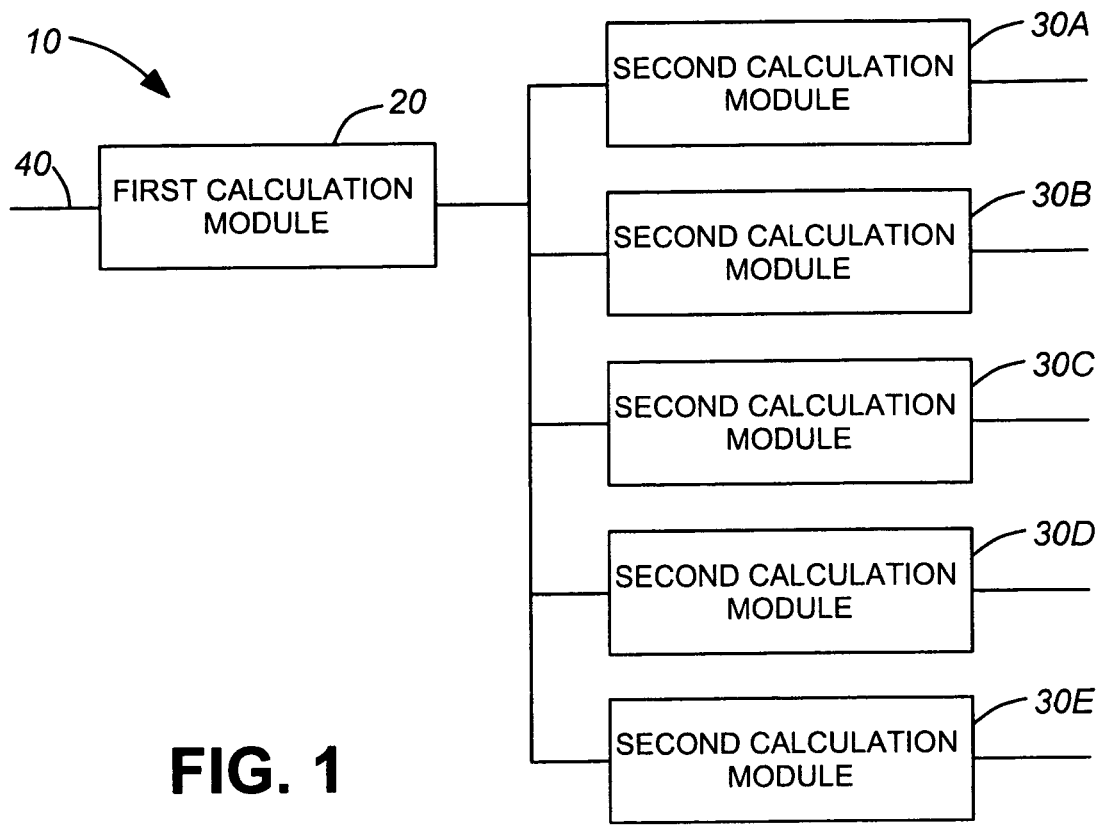
FIG. 1 illustrates a block diagram of a system according to the invention.

Referring to FIG. 1, a block diagram of the system 10 is presented. A first calculation module 20 is coupled to multiple second calculation modules 30A-30D. The first calculation module 20 receives an encoded set of data bits as input 40 and calculates the metrics or measurement of the differences between the encoded set and each one of a given set of predetermined branch values. As noted above, each branch value is a possible predecessor state the current state as denoted by the input encoded set. For a hard decision implementation, the number of differences is then output by the first calculation module 20 to be received by the second calculation modules 30A-30D.

Each second calculation module 30A-30D receives the metrics from the first calculation module 20. These metrics are then used in determining the cumulative metric for each of the possible paths. Each second calculation module represents a predecessor state from which the encoded set may have derived. For each of these predecessor states, there are a number of paths through which the encoded set would have passed through to arrive at the predecessor state represented by the second calculation module. The metrics from the first calculation module are thus used to determine, for each predecessor state, which path was most likely taken to arrive at the encoded set. For each path, a predetermined criteria is then applied against the cumulative metrics and only those which meet this criteria are allowed to be output from the second calculation module. Thus, for each one of the predecessor states represented by a second calculation module 30, each second calculation module outputs a number denoting the cumulative metrics for a "survivor" path from the multiplicity of possible paths. These "survivor" paths, one for each predecessor state, are then stored in a memory subsystem. These can then be used in tracing back the route or path to the original unencoded data bits.

Figure 2:
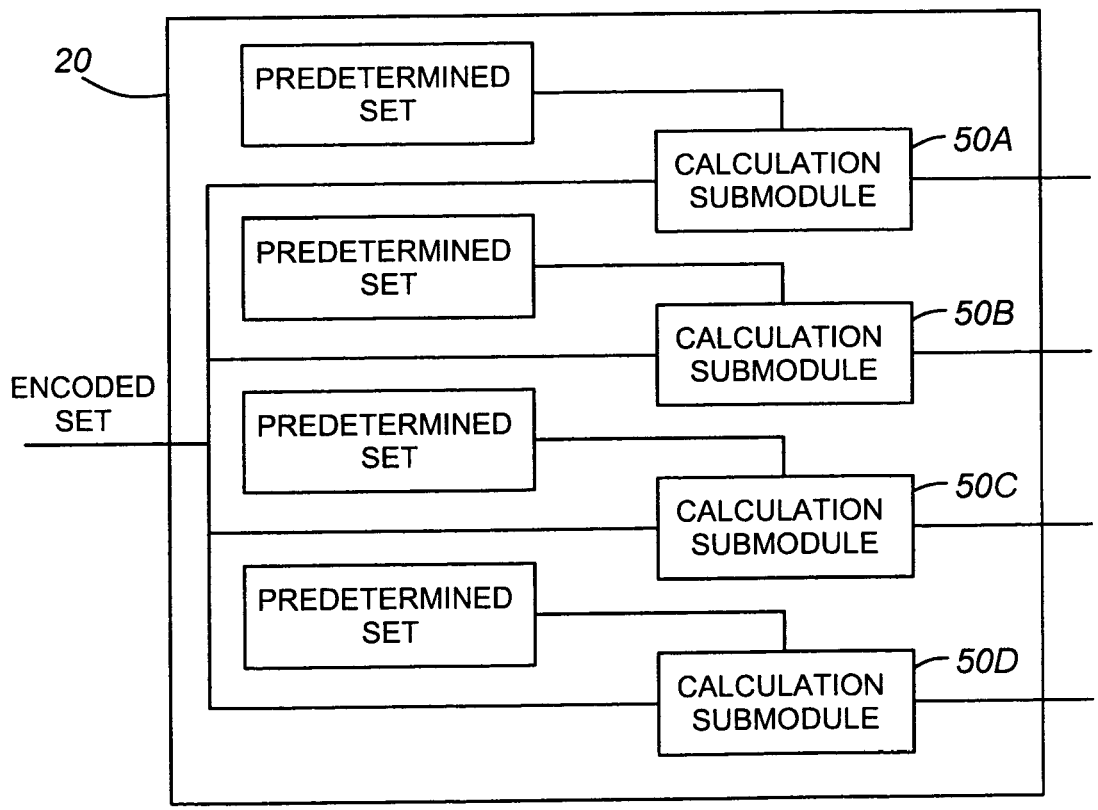
FIG. 2 illustrates a block diagram of the first calculation module of FIG. 1.

Referring to FIG. 2, a block diagram of the first calculation module 20 of FIG. 1 is illustrated. As can be seen, multiple calculation submodules 50A, 50B, 50C, 50D receive the encoded set in parallel. Each one of the calculation submodules also receives a different preprogrammed or predetermined set of data bits against which to compare to the encoded set. Each one of these predetermined sets of data bits represents a branch value. Each calculation submodule determines how different the incoming encoded set is from a predetermined branch value.

Figure 3:
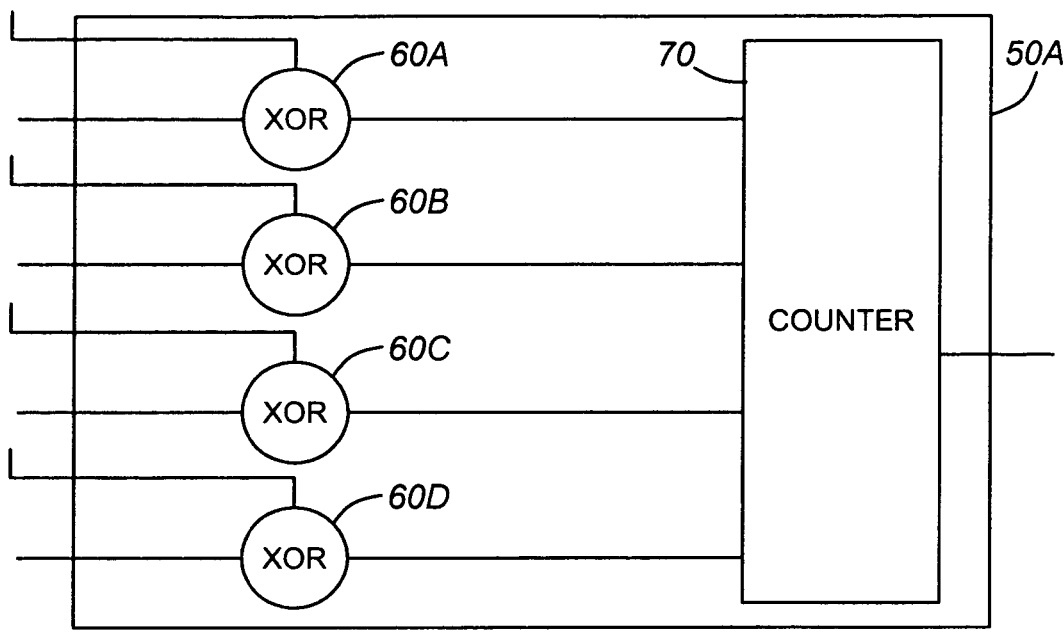
FIG. 3 illustrates a block diagram of an example of a calculation submodule.

Referring to FIG. 3, a block diagram of a calculation submodule 50A is illustrated. As can be seen, multiple XOR gates 60A, 60B, 60C each receive a single bit from both the encoded set and one of the predetermined branch values. The XOR operation determines if the two bits are alike or not. The results of the XOR operation are then received by a counter 70. The counter 70 counts the number of instances when the encoded bit differs from the bit from the predetermined set. The output of the counter 70, the number of differences between the encoded set and one of the predetermined set, is the output of the calculation submodule.

It should be noted that the metric produced by the calculation submodules 50A-50D is also referred to as a signal distance or Hamming distance between the two sets of data bits. Depending on how one calculates it, the signal distance may be the number of bits which are different (e.g. 10111 and 11101 are different at the second and fourth (from right) positions so signal distance is 2) or the number of bits which are the same (e.g. 10111 and 11101 are the same at positions 1, 3, and 5 (again counting from the right) so the signal distance is 3). For the implementation explained here, signal distance is the number of bits that do not correspond. However, this implementation can easily be adjusted to conform to the other method of calculating signal distance. It should be noted that the above is for a hard decision implementation of the invention. For a soft decision implementation, soft decision metric calculations can be used.

It should further be noted that, to speed up the calculations the number of calculation submodules ideally correspond to the number of possible states or branch values. Thus, in one implementation, 64 states are used and 64 separate calculation submodules are used with all 64 calculation submodules being clocked and operated in parallel.

The output of the first calculation module 20, being composed of multiple pieces of data with each containing a signal distance, may be output as either serial or parallel data. If output as serial data, the specific predetermined state to which a metric or signal distance belongs may be specified within the signal. If output as parallel data, each signal distance can be received separately as being for a specific state. For the implementation discussed here, a parallel output is more useful. It should be clear that the output of the first calculation module 20 are discrete pieces of data, each of which denotes a measure of the differences between one branch value and the incoming encoded set.

Figure 4:
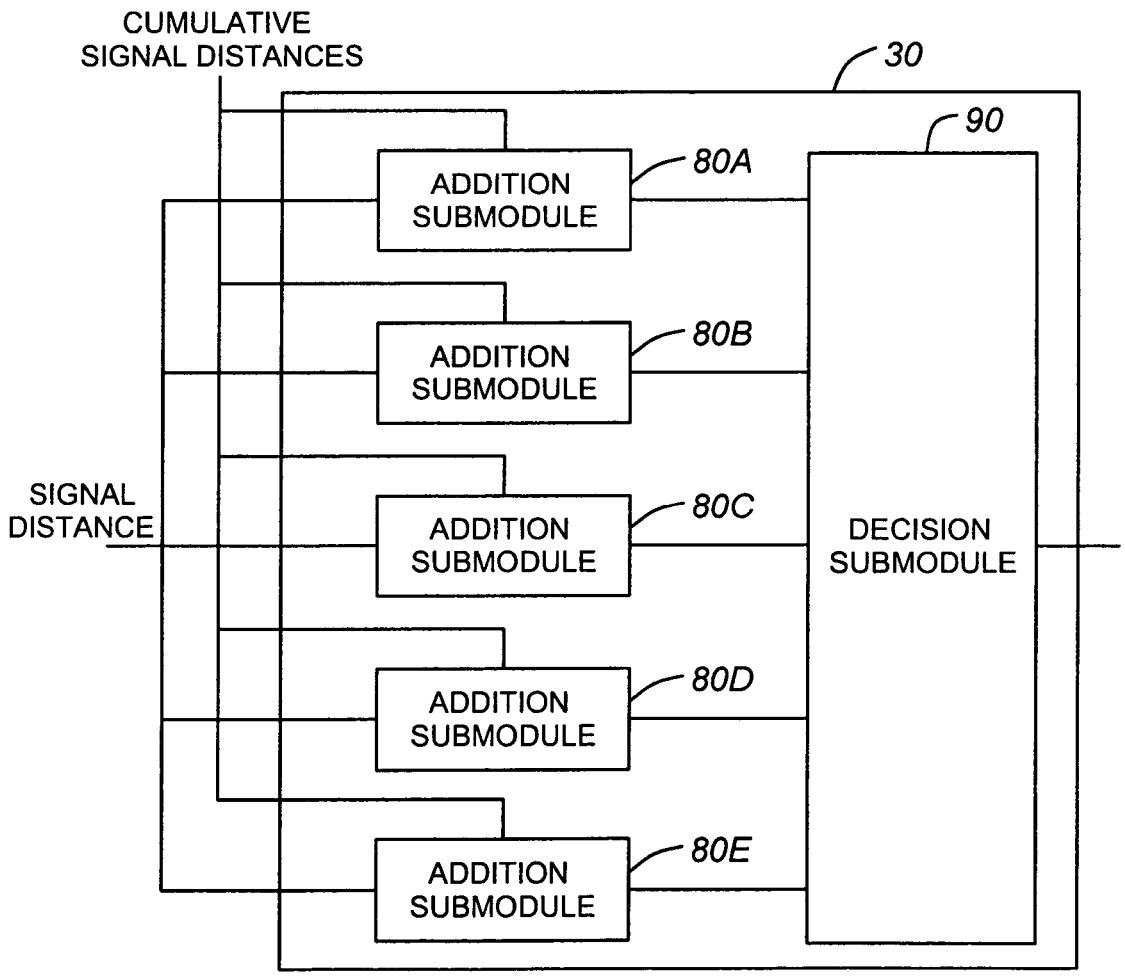
FIG. 4 illustrates a block diagram of a second calculation module.

Referring to FIG. 4, a block diagram of a second calculation module is illustrated. As can be seen, within the second calculation module 30 are parallel addition submodules 80A-80E. Each addition submodule 80A-80E receives one of the metrics from the first calculation module 20 along with a specific cumulative signal distance corresponding to a specific path. Each addition submodule then adds these two values. Each cumulative signal is received as a previous output of one of the second calculation modules 30A-30D. Also present in the second calculation module 30 is a decision submodule 90. This decision submodule 90 receives the output of the addition submodules 80A-80E and determines which of the outputs are either the highest or the lowest (depending on the implementation) and outputs this as the output of the second calculation module 30. As noted above, each addition submodule 80A-80E corresponds to a path to which leads to the predecessor state represented by the second calculation module. The cumulative signal distance is the cumulative signal distance for a specific previous path through which this predecessor state leads. By adding the signal distances from the calculation submodules to the cumulative signal distance for a path, the next segment of that path can be determined. The decision submodule determines which of the possible path segments, as represented by the signal distances from the calculation submodules, are to be "taken". The output of each second calculation module is therefore an indication of which path segment led to the predecessor state represented by that second calculation module.

It should be noted that the criteria implemented by the decision submodule 90 depends on the implementation of the signal distance. If signal distance is implemented as the number of bits by which two sets of bits differ, then the decision submodule outputs the smallest or lowest valued. On the other hand, if signal distance is implemented as the number of bits by which two sets of bits agree or correspond, then the decision submodule 90 outputs the largest or highest valued output from the addition submodules.

As noted above, the number of second calculation modules correspond to the number of states. The number of addition submodules in each second calculation module depends on the number of possible predecessor states. For one implementation using a 6 bit encoded set with 64 states (each being a 6 bit set) there are 8 possible paths to each state, each path corresponding to a single branch value. Thus, 64 second calculation modules (corresponding to 64 states) are used, with each second calculation module having 8 addition submodules (corresponding to 8 possible path segments) in each second calculation module. This results in 592 addition submodules in total. This implementation therefore yields 64 pieces of data—64 cumulative signal distances with each one corresponding to a specific path. Each one of these cumulative signal distances may be indexed so that, when stored in a memory subsystem for a trace back process referred to above, they may easily be retrieved.

Figure 5:
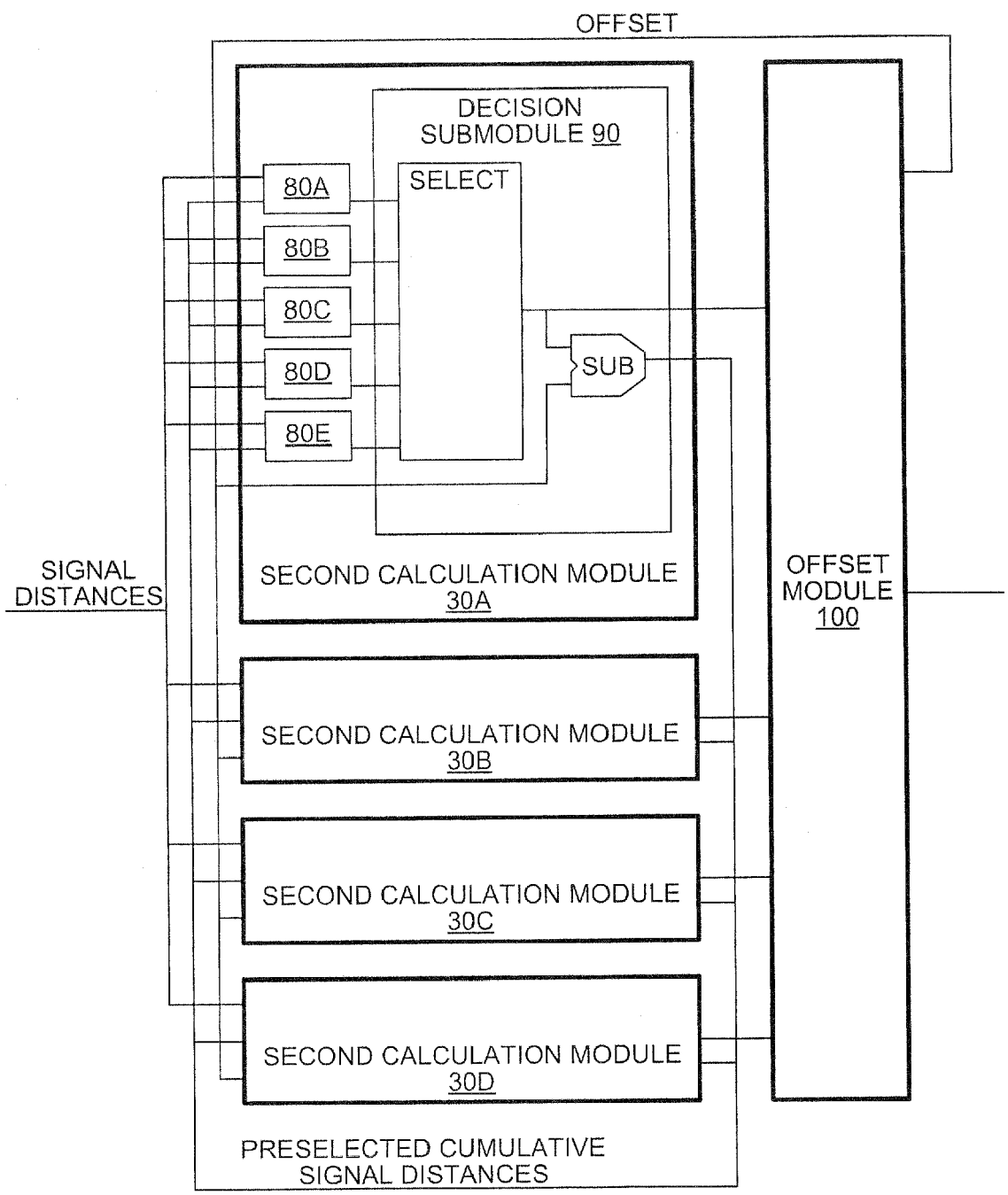
FIG. 5 is a system similar to FIG. 1 but using an offset module.

To reduce the number of bits in the cumulative signal distance sums being generated, an offset value can be subtracted from each cumulative signal distance. To generate this, all the outputs of the second calculation modules 30A-30E are fed to an offset module 100 (see FIG. 5). The offset module then determines the lowest or smallest valued cumulative signal distance from all the cumulative signal distance sums output by the second calculation modules. The value of this selected cumulative signal distance is then subtracted from all the other cumulative signal distances prior to being received by the second calculation modules 30A-30E.

To determine which cumulative signal distance and which metric (from the first calculation module 20) are to be added by an addition submodule, the state represented by a particular second calculation module to which the addition submodule belongs must be a possible predecessor state for the branch value represented by the metric. As an example, if branch values A, B, C, and D have metrics A1, B1, C1, and D1 relative to the encoded set, and state Z is a possible predecessor state for branch values A, B, C, and D, then all of the metrics A1, B1, C1 and D1 are added to a specific cumulative signal distance Z1 corresponding to a path leading to state Z. This means that A1, B1, C1 and D1 are all added separately to the cumulative signal distance Z1 for the path passing through state Z. Once all of the metrics and signal distances have been added, the resulting cumulative distance (whether from adding A1 to Z1, adding B1 to Z1, adding C1 to Z1, or adding D1 to Z1) that meets the criteria of the decision submodule is selected as the output.

Once all the requisite calculations have been done, the cumulative signal distances for all the predecessor states are output by the system as a whole. This output already takes into account the "survivor" paths for each of predecessor states. As part of the offset module, a decision may also be made by the offset module identifying which predecessor state and the path it represents (as determined by the cumulative signal distances) has the lowest value. This path with the lowest value is marked by marking its present state as the "survivor" predecessor state for the present transition.

It should be noted that since trellis based decoding and, more specifically, Viterbi decoding is deterministic (i.e. the relationships between the different states can be predetermined), the connections to the addition submodules are hand-wired. In other words, since it can be determined that for a given predecessor state S only branch values S1, S2, S3, S4 may result, only the metrics for branch values S1, S2, S3 and S4 are to be separately connected to the addition submodules for the second calculation module representing state S. These handwired connections are to be predetermined and preattached during the manufacturing of the modules.

It should further be noted that all of the modules and submodules discussed above are combinational circuits. As such, a single clock signal pulse or edge (depending on the implementation) will cause the whole system to produce its required output—the predecessor states with their cumulative signal distances and a final "survivor" state with the lowest cumulative signal distance.

The above described system is most suited for processing multiple bit encoded sets. Previously, trellis based decoding systems used single bit decoders—decoders that received a two bit encoded set and produced a single unencoded bit (for a ½ encoding rate). The above system multiplies the decoding capabilities of current decoders by, instead of receiving two-bit encoded sets, receiving multiples of two-bit encoded sets. Thus, for a six bit encoded set (again using a ½ encoding rate), the above system, in conjunction with a suitable memory system for the traceback process, will produce three decoded bits per cycle. The parallel implementation of the different submodules allow for multiple calculations to be accomplished simultaneously. To assist such a parallel implementation, the encoded set is also input in parallel.

As noted above, the output of the system as a whole may be the "surviving" state—the predecessor state which has the lowest cumulative signal distance. This output may then be used as a starting point for the above-mentioned traceback process.

An implementation which processes 6 bits as the input data set (as opposed to the conventional 2 bit input data set for a ½ encoding rate), thereby processes 3 bits per clock signal. Since for the ½ encoding rate, each 2 bit encoded data set corresponds to a single unencoded bit, then by processing 6 encoded bits at a time, data which results in 3 unencoded bits per clock cycle is produced. Thus, if a decoding rate of about 60 MHz is desired, instead of providing a 60 MHz clock signal to a 1-bit serial decoder which produces 1 decoded bit per clock cycle, a 20 MHz clock signal may be provided to the above described system. Using a 20 MHz clock, 3 unencoded bits are produced per block cycle, thereby roughly equalling the data throughput of the higher clocked 1-bit decoder. Thus, a lower clock frequency can be used to produce the same output of a much higher clocked system.

The above system may be implemented in silicon as all integrated microchip or as physically separate components. The multiple second calculation modules may be implemented as a single monolithic module.

A person understanding this invention may now conceive of alternative structures and embodiments or variations of the above all of which are intended to fall within the scope of the invention as defined in the claims that follow.

What is claimed is:

1. A system for decoding an encoded set of data bits, the system comprising:
   a first calculation module configured to calculate a signal distance between the encoded set of data bits and each one of a predetermined set of branch values, wherein each one of the predetermined set of branch values includes a predetermined sequence of data bits; and
   a plurality of second calculation modules operating in parallel and configured to calculate a corresponding plurality of cumulative signal distances, wherein each cumulative signal distance corresponds to each one of a predetermined set of predecessor states, wherein each second calculation module is associated with a specific one of the predetermined set of predecessor states;
   wherein the first calculation module comprises:
   a plurality of calculation submodules configured to operate in parallel, wherein each calculation submodule includes:
      a plurality of XOR gates, wherein each XOR gate is configured to generate a corresponding output in response to a difference between a corresponding bit from the encoded set of data bits and a corresponding bit from one of the predetermined set of branch values; and
      a counter configured to count a number of instances the corresponding output of each of the XOR gates indicates the difference; and
   wherein each second calculation modules includes:
      a plurality of addition submodules configured to operate in parallel, wherein each addition submodule is configured to add a preselected signal distance calculated by the first calculation module to a preselected cumulative signal distance calculated by each of the plurality of second calculation modules; wherein each addition submodule further comprises an addition circuit configured to receive both the preselected signal distance and the preselected cumulative signal distance in digital format wherein an output of each addition circuit is a number in binary format that is a sum of the preselected signal distance and the preselected cumulative signal distance; and
      a decision submodule configured to subtract an offset value from each of the plurality of cumulative signal distances calculated by the plurality of second calculation modules and configured to select one of a plurality of cumulative signal distance sums calculated by the plurality of the addition submodules in response to the offset cumulative signal distances the decision submodule is configured to receive outputs from the plurality of addition submodules, wherein the decision submodule is configured to provide a decision submodule output, one of the outputs of the addition submodules that meets a specific predetermined criterion, and wherein the decision submodule output is provided as a new cumulative signal distance for one of the predetermined set of predecessor states associated with a second calculation module containing the decision submodule.

2. The system of claim 1, wherein
an output of each calculation submodule is a multiple-bit binary number.

3. A module for use in trellis-based decoding of encoded sets of data bits, the module comprising:
   a plurality of calculation submodules configured to operate in parallel, wherein each calculation submodule includes:
      a plurality of XOR gates, wherein each XOR gate is configured to generate a corresponding output in response to a difference between a corresponding bit from the encoded set of data bits and a corresponding bit from one of the predetermined set of branch values; and
      a counter configured to count a number of instances the corresponding output of each of the XOR gates indicates the difference and configured to provide the counted number as a preselected signal distance in binary format;
   a plurality of four or more addition submodules configured to operate in parallel, wherein each addition submodule includes an addition circuit configured to receive both the preselected signal distance and a preselected cumulative signal distance in binary format, and wherein each addition circuit is further configured to add the preselected signal distance and the preselected cumulative signal distance; and
   a decision submodule configured to receive outputs from the plurality of addition submodules, configured to subtract an offset value from each of the preselected cumulative signal distances, and configured to determine which one of the outputs conforms to a predetermined criterion the decision submodule is configured to receive outputs from the plurality of addition submodules, wherein the decision submodule is configured to provide a decision submodule output, one of the outputs of the addition submodules that meets a specific predetermined criterion, and wherein the decision submodule output is provided as a new cumulative signal distance for one of a predetermined set of predecessor states associated with a calculation module containing the decision submodule;
   wherein the module is enabled to process a respective path of the trellis based decoding for each of addition submodules.

4. The calculation module of claim 3, wherein the decision submodule is further configured to determine at least one of the outputs having a lowest value.

5. The system of claim 1, wherein the decision submodule is further configured to determine at least one of the outputs having a lowest value.

6. A system, comprising:
   first calculation means for calculating a signal distance between two or more encoded sets of data bits and each one of a predetermined set of branch values;
   plural second calculation means, operating in parallel, for calculating corresponding plural cumulative signal distances, wherein each cumulative signal distance corresponds to one of a predetermined set of predecessor states;
   wherein the first calculation means includes:
   plural calculation submodule means configured to operate in parallel, wherein each calculation submodule means comprises:
      plural XOR gate means for generating corresponding outputs in response to differences between corresponding bits from the encoded sets of data bits and corresponding bits from each one of the predetermined sets of branch values; and
      counting means for counting a number of instances the corresponding output of each of the XOR gate means indicates the difference and for providing the counted number as a preselected signal distance; and
   wherein each second calculation means includes:
      four or more addition means for calculating respective cumulative distance sums by adding the preselected signal distance calculated by the counting means to a preselected cumulative signal distance calculated by each second calculation means wherein each one of the four or more addition means comprises an add means for receiving both the preselected signal distance and the preselected cumulative signal distance in digital format, wherein an output of each add means is a number in binary format that is a sum of the preselected signal distance and the preselected cumulative signal distance; and
   decision means for subtracting an offset from each of the plurality of cumulative signal distances and for selecting one of the cumulative distance sums in response to the offset cumulative signal distances wherein the decision means is configured to receive outputs from the four or more addition means, wherein the decision means is configured to provide as a decision means output one of the outputs from the four or more addition means that meets a specific predetermined criterion, and wherein the decision means output is provided as a new cumulative signal distance for one of the predetermined set of predecessor states associated with a second calculation means containing the decision means.

7. The system of claim 6, wherein
an output of each calculation submodule is a multiple-bit binary number.

* * * * *

UNITED STATES PATENT AND TRADEMARK OFFICE
CERTIFICATE OF CORRECTION

PATENT NO. : 7,623,585 B2 Page 1 of 1
APPLICATION NO. : 10/377859
DATED : November 24, 2009
INVENTOR(S) : Maher Amer It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 976 days.

Signed and Sealed this

Twenty-sixth Day of October, 2010

David J. Kappos
*Director of the United States Patent and Trademark Office*

UNITED STATES PATENT AND TRADEMARK OFFICE
CERTIFICATE OF CORRECTION

PATENT NO. : 7,623,585 B2 Page 1 of 1
APPLICATION NO. : 10/377859
DATED : November 24, 2009
INVENTOR(S) : Maher Amer It is certified that error appears in the above-identified patent and that said Letters Patent is hereby corrected as shown below:

Column 7, line 54 (Claim 1):   Delete "modules" and replace with --module--;

Column 7, line 60 (Claim 1):   Delete "modules;" and replace with --modules,--;

Column 8, line 7 (Claim 1):    Delete "distances" and replace with --distances,--;

Column 8, line 51 (Claim 3):   Delete "criterion" and replace with --criterion,--;

Column 8, line 63 (Claim 4):   Delete "trellis based" and replace with --trellis-based--; and Column 10, line 3 (Claim 6):   Delete "means" and replace with --means,--.

Signed and Sealed this

Ninth Day of November, 2010

David J. Kappos
*Director of the United States Patent and Trademark Office*